United States Patent
Bednarowski et al.

(10) Patent No.: US 10,483,730 B2
(45) Date of Patent: Nov. 19, 2019

(54) METHOD OF BUILDING AN INSULATION SYSTEM AROUND A NAKED CONDUCTOR SECTION OF A POWER CABLE

(71) Applicant: NKT HV Cables GmbH, Baden (CH)

(72) Inventors: Dariusz Bednarowski, Kraków (PL); Emmanuel Logakis, Baden (CH); Jörn Antonischki, Fågelmara (SE); Julita Krol, Gdów (PL); Lei Xie, Mellingen (CH); Nikolaus Zant, Raleigh, NC (US)

(73) Assignee: NKT HV Cables GmbH, Baden (CH)

( * ) Notice: Subject to any disclaimer, the term of this patent is extended or adjusted under 35 U.S.C. 154(b) by 114 days.

(21) Appl. No.: 15/740,518

(22) PCT Filed: Jul. 6, 2015

(86) PCT No.: PCT/EP2015/065356
§ 371 (c)(1),
(2) Date: Dec. 28, 2017

(87) PCT Pub. No.: WO2017/005289
PCT Pub. Date: Jan. 12, 2017

(65) Prior Publication Data
US 2018/0191142 A1    Jul. 5, 2018

(51) Int. Cl.
*H02G 1/14* (2006.01)
*H01B 9/02* (2006.01)
(Continued)

(52) U.S. Cl.
CPC ......... *H02G 1/145* (2013.01); *B29C 45/1671* (2013.01); *B29C 45/2708* (2013.01);
(Continued)

(58) Field of Classification Search
CPC . B29C 45/1671; B29C 45/2708; B29C 45/28; H01B 9/027; H01B 13/06; H01L 21/0243; H01L 23/142
(Continued)

(56) References Cited

U.S. PATENT DOCUMENTS

| | | | | |
|---|---|---|---|---|
| 3,142,716 A | * | 7/1964 | Gardener | B29C 45/14073 249/95 |
| 4,145,176 A | * | 3/1979 | Nelson | B29C 45/14549 249/163 |
| 5,560,882 A | * | 10/1996 | Daguet | B29C 45/14639 264/265 |

FOREIGN PATENT DOCUMENTS

| CN | 102 611 067 A | * | 7/2012 |
|---|---|---|---|
| CN | 102611067 A | | 7/2012 |

(Continued)

OTHER PUBLICATIONS

International Preliminary Report on Patentability Application No. PCT/EP2015/065356 Completed: Jul. 17, 2017 7 Pages.
(Continued)

*Primary Examiner* — Timothy J Thompson
*Assistant Examiner* — Charles Pizzuto
(74) *Attorney, Agent, or Firm* — Whitmyher IP Group LLC (57) ABSTRACT

A method of building an insulation system around a naked conductor section of a power cable. The insulation system includes an inner semiconducting layer arranged around the conductor, an insulation layer arranged around the inner semiconducting layer, and an outer semiconducting layer arranged around the insulation layer. The method includes: a) placing the naked conductor section in a mold, and b) molding an insulation system around the naked conductor section, wherein the molding of the insulation system involves injecting a first semiconducting compound into a
(Continued)

first mold cavity to form an inner semiconducting layer around the naked conductor section, injecting an insulation compound into a second mold cavity to form an insulation layer around the inner semiconducting layer, and injecting a second semiconducting compound into a third mold cavity to form an outer semiconducting layer around the insulation layer.

18 Claims, 5 Drawing Sheets

(51) Int. Cl.
    *H01B 13/06*     (2006.01)
    *H01L 21/02*     (2006.01)
    *H01L 23/14*     (2006.01)
    *B29C 45/16*     (2006.01)
    *B29C 45/27*     (2006.01)
    *B29C 45/28*     (2006.01)
    *B29C 45/14*     (2006.01)
    *B29C 45/26*     (2006.01)

(52) U.S. Cl.
    CPC ............ *B29C 45/28* (2013.01); *H01B 9/027* (2013.01); *H01B 13/06* (2013.01); *H01L 21/0243* (2013.01); *H01L 23/142* (2013.01); *B29C 45/14549* (2013.01); *B29C 45/2673* (2013.01); *B29C 2045/2714* (2013.01)

(58) Field of Classification Search
    USPC .................................................. 174/76, 667
    See application file for complete search history.

(56) References Cited

FOREIGN PATENT DOCUMENTS

| | | |
|---|---|---|
| EP | 0266900 A2 | 5/1988 |
| EP | 1128514 A1 | 8/2001 |
| GB | 857376 A | 12/1960 |
| GB | 1 569 656 A * | 6/1980 |
| GB | 1569656 A | 6/1980 |
| JP | S60156689 U | 10/1985 |
| JP | S6391211 A | 4/1988 |
| JP | 2000228813 A | 8/2000 |
| JP | 2001268770 A | 9/2001 |
| JP | 2010119291 A | 5/2010 |
| JP | 2011020263 A | 2/2011 |
| WO | 2010130291 A1 | 11/2010 |
| WO | WO 2010/130291 * | 11/2010 |

OTHER PUBLICATIONS

International Search Report & Written Opinion of the International Searching Authority Application No. PCT/EP2015/065356 Completed: May 11, 2016; dated May 23, 2016 19 Pages.
Japanese Office Action and Translation, Application No. JP 2018-500522, Completed: Jul. 30, 2019, 11 pages.

* cited by examiner

METHOD OF BUILDING AN INSULATION SYSTEM AROUND A NAKED CONDUCTOR SECTION OF A POWER CABLE

TECHNICAL FIELD

The present disclosure generally relates to power cables. In particular, it relates to a method of building an insulation system around a naked conductor section of a power cable.

BACKGROUND

Today high voltage (HV) cables are typically made of cross-linked polyethylene (XLPE). Cross-linking can be achieved by the addition of low amounts of dicumyl peroxide (DCP) in a low density polyethylene (LDPE) base material.

Factory, sea or flexible HV power cable joints are normally manufactured using cross-linkable tapes wound around the conductor in several layers. These layers may consist of an innermost layer that may be made of a semiconducting material, an insulating layer arranged around the semiconducting layer, and an outermost layer also made of a semiconducting material. The insulating layer may for example be made of XLPE and the semiconducting layers may be made of carbon-black filled XLPE. The tapes are manually lapped between the two cable ends of the tapered insulation of the two cables that are to be jointed. Each of these three layers is then cured under heat and pressure in a separate step so that the tapes melt together forming a homogeneous material without any voids.

The tapes used for the insulation system of the factory joints and the factory joints as such are manufactured in the cable factory under strict cleanness conditions. The same applies also in case the insulation system of a defected power cable is to be restored. The manual jointing or restoration procedure is lengthy and vulnerable to contamination. It may require up to four days, or more, of manufacturing time, including the required crosslinking process, in three shift work schedule. Moreover, a person performing the jointing/restoration procedure must be trained for several years before being authorised to perform the jointing. Furthermore, additional time is essential for heat treatment in order to degas polar by-products of the crosslinking reaction, known to impair the insulation's performance. The latter process can last from few days up to weeks.

SUMMARY

In view of the above, an object of the present disclosure is to solve, or at least mitigate, the problems of the prior art.

Hence, according to a first aspect of the present disclosure there is provided a method of building an insulation system around a naked conductor section of a power cable, which power cable has a conductor which includes the naked conductor section and which power cable comprises an insulation system already provided around a majority of the conductor, which insulation system comprises an inner semiconducting layer arranged around the conductor, an insulation layer arranged around the inner semiconducting layer, and an outer semiconducting layer arranged around the insulation layer, and wherein the method comprises: a) placing the naked conductor section in a mold, and b) molding an insulation system around the naked conductor section, wherein the molding of the insulation system involves injecting a first semiconducting compound into a first mold cavity to form an inner semiconducting layer around the naked conductor section, injecting an insulation compound into a second mold cavity to form an insulation layer around the inner semiconducting layer, and injecting a second semiconducting compound into a third mold cavity to form an outer semiconducting layer around the insulation layer.

An effect obtainable thereby is that of reduced manufacturing and heat treatment time/costs. By utilizing injection molding it is anticipated that the manufacturing time of the insulation system may be reduced with up to 40%, mainly resulting from the absence of long vulcanization steps, and in addition eliminate fully any time spent for heat treatment in a degassing free cable system.

Additional advantages include no costs for the production of semiconducting layer tapes and insulating layer tapes, as no tapes are needed. Furthermore, the production quality can be kept more constant e.g. due to less operator dependent process. This results in improved performance and reliability because of fewer voids and defects, better interfaces and a cleaner manufacturing process.

According to one embodiment step a) comprises placing the naked conductor section in a first mold insert in the mold, the first mold insert forming the first mold cavity and having a first inner diameter.

According to one embodiment step a) further comprises placing a first sealing ring around the insulation system to seal the first mold insert at one end thereof and placing a second sealing ring around the insulation system to seal the first mold insert at the other end thereof.

According to one embodiment step b) comprises b1) injecting the first semiconducting compound into the first mold insert, thereby providing the inner semiconducting layer around the naked conductor section, and thus forming a section provided with an inner semiconducting layer, b2) removing the first mold insert from the mold and placing a second mold insert with a second inner diameter that is larger than the first inner diameter into the mold, the second mold insert forming the second mold cavity, b3) placing the joint section provided with the inner semiconducting layer in the second mold insert, b4) injecting the insulation compound into the second mold insert, thereby providing the insulation layer around the inner semiconducting layer of the section provided with the inner semiconducting layer, and thus forming a section provided with an insulation layer, b5) removing the second mold insert from the mold and placing a third mold insert with a third inner diameter that is larger than the second inner diameter into the mold, the third mold insert forming the third mold cavity, b6) placing the section provided with the insulation layer in the third mold insert, and b7) injecting the second semiconducting compound into the third mold insert, thereby providing the outer semiconducting layer around the insulation layer of the section provided with the insulation layer.

By utilizing several mold inserts, one for each layer to be molded the costs may be lowered because one mold may be used for all the layers. Moreover, the utilization of a single mold with mold inserts reduces manufacturing time as there is no need to replace the entire mold for each layer.

According to one embodiment step b3) further comprises placing a third sealing ring around the insulation system to seal the second mold insert at one end thereof and placing a fourth sealing ring around the insulation system to seal the second mold insert at the other end thereof.

According to one embodiment step b6) further comprises placing a fifth sealing ring around the insulation system to seal the third mold insert at one end thereof and placing a sixth sealing ring around the insulation system to seal the third mold insert at the other end thereof.

By selecting suitable dimensions of the sealing rings any plastic deformation of the cable may be avoided. Any plastic deformation of the insulation layer and semiconducting layers would negatively affect electrical performance inducing local field enhancements.

According to one embodiment each of the first sealing ring, second sealing ring, third sealing ring, fourth sealing ring, fifth sealing ring, and sixth sealing ring are made of metal.

According to one embodiment the mold comprises a ring-shaped runner system having a ring-shaped runner which in the beginning of each mold cycle only has a single gate opening, which single gate opening is located opposite to a sprue.

According to one embodiment the mold comprises a movable sleeve arranged in a first position at the beginning of each mold cycle thereby forming the single gate opening, wherein the method comprises moving the sleeve axially from the first position to a second position to obtain a gate along the entire circumference of the ring-shaped runner, wherein the sleeve is moved from the first position to the second position when any of the first semiconducting compound, the insulation compound and the second semiconducting compound has reached the single gate opening.

Thereby uniform filling of the cavity may be obtained. Conventional runner systems would lead to a non-balanced filling of the cavity which potentially can cause issues of eccentricity of the conductor, which in turn leads to detrimental electrical performance. The ring-shaped runner system furthermore reduces the risk of obtaining pronounced weld-line(s), which potentially can affect negatively electrical and mechanical performance of the jointed power cable. Furthermore, due to the semi-open gate structure of the ring-shaped runner system, any air may be pressed into the mold cavity during molding, resulting from the ring-shaped runner being filled with an injected compound. Thereby any air trap/diesel effect problems in the ring-shaped runner may be avoided.

This ring-shaped runner system may be utilised when molding all three layers, i.e. the inner semiconducting layer, the insulation layer and the outer semiconducting layer. Each mold insert may for example be provided with a respective ring-shaped runner system for this purpose.

According to one embodiment the mold comprises a sensor arranged to sense one of pressure and temperature to determine whether one of the first semiconducting compound, the insulation compound and the second semiconducting compound has reached the single gate opening after having been injected into the ring-shaped runner.

According to one embodiment the power cable is a high voltage power cable.

According to one embodiment each of the first semiconducting compound and the second semiconducting compound comprises a thermoplastic material filled with semiconducting or conductive inclusions and the insulation compound is a thermoplastic material.

According to one embodiment the power cable is a first power cable wherein the conductor is a first conductor having a first naked conductor section, wherein the method comprises, prior to step a), jointing the first naked conductor section with a second naked conductor section of a second power cable to obtain the naked conductor section, which second power cable has a second conductor and inner semiconducting layer arranged around the second conductor, an insulation layer arranged around the inner semiconducting layer, and an outer semiconducting layer arranged around the insulation layer.

According to a second aspect of the present disclosure there is provided a power cable obtainable by the method according to the first aspect presented herein.

Generally, all terms used in the claims are to be interpreted according to their ordinary meaning in the technical field, unless explicitly defined otherwise herein. All references to "a/an/the element, apparatus, component, means", etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which:

FIGS. 5b and 5c show perspective views of the ring-shaped runner system in FIG. 5a.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

The present disclosure relates to a method of building, or completing, an insulation system around a naked conductor section of a power cable, which power cable already has an existing insulation system arranged around the majority of the conductor of the power cable. The insulation system that is built around the naked conductor section is built by means of molding an inner semiconducting layer around the naked conductor section of the power cable, by molding an insulation layer around the inner semiconducting layer, and by molding an outer semiconducting layer around the insulation layer. The building may involve the restoration of the insulation system of a power cable which has an insulation system with manufacturing defects, or it may involve the jointing of a first power cable and a second power cable thus forming a power cable, in which case an insulation system is built around the naked conductor section, which includes the joint between the two jointed conductors of the first power cable and the second power cable. This type of insulation system building is normally performed in the factory as the restoration requires high degrees of cleanness in order not to introduce impurities into the insulation system.

The power cable may be a high voltage power cable. The power cable may be an alternating current (AC) power cable having a plurality of cores, namely one for each electrical phase, in which case each core may be jointed according to the methods described herein, or a direct current (DC) power cable.

A first example of building an insulation system around a naked conductor section of a power cable will now be described. In this example, the building involves building or manufacturing an insulation system of a jointed first power cable and second power cable.

Figure 3:
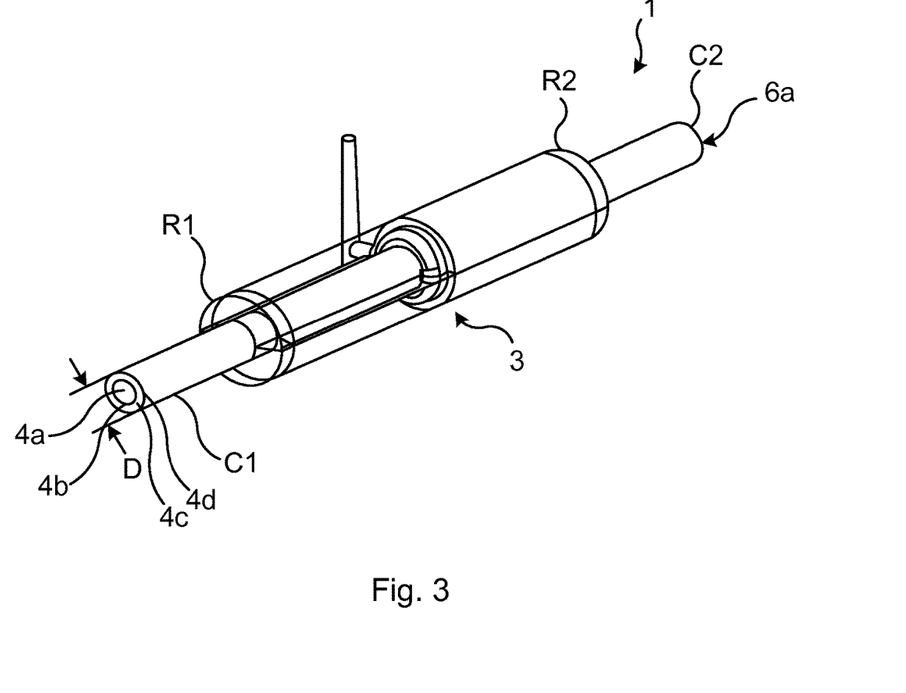
FIG. 3 is a schematic view of an example of an arrangement utilised for manufacturing an insulation system by means of molding in accordance with the methods of FIGS. 1 and 2.

As shown in FIG. 3, the first power cable C1 comprises a first conductor 4a, and a first insulation system comprising an inner semiconducting layer 4b arranged around the first conductor 4a, an insulation layer 4c arranged around the inner semiconducting layer 4b and an outer semiconducting layer 4d arranged around the insulation layer 4c.

Similarly to the first power cable C1, the second power cable comprises a second conductor, and a second insulation system comprising an inner semiconducting layer arranged around the second conductor, an insulation layer arranged around the inner semiconducting layer and an outer semiconducting layer arranged around the insulation layer.

In order to prepare for the jointing disclosed herein, the first insulation system normally has a tapering section, which tapers towards a naked end section of the first conductor. Similarly, the second insulation system normally has a tapering section, which tapers towards a naked end section of the first conductor.

By means of the methods presented herein, each of the first insulation system and the second insulation system may be restored so that when the naked end section of the first conductor and the naked end section of the second conductor have been jointed, a single integrated insulation system may be obtained. The jointing disclosed herein replaces current jointing solutions utilizing several layers of tapes wound around the jointed conductors of the first power cable and the second power cable to restore the insulation system thereof.

In order to joint the first power cable with the second power cable, it is assured that the first conductor has a naked end section, without the first insulation system. This may be obtained either by not providing any first insulation system to this part of the first conductor in the first place, or the first insulation system may be removed from this section of the first power cable for the purpose of jointing. The first insulation system may taper towards the naked end section of the first conductor.

Furthermore, the second conductor has a naked end section, without the second insulation system. This may be obtained either by not providing any second insulation system to this part of the second conductor in the first place, or the second insulation system may be removed from this section of the second power cable for the purpose of jointing. The second insulation system may taper towards the naked end section of the second conductor.

Figure 1:
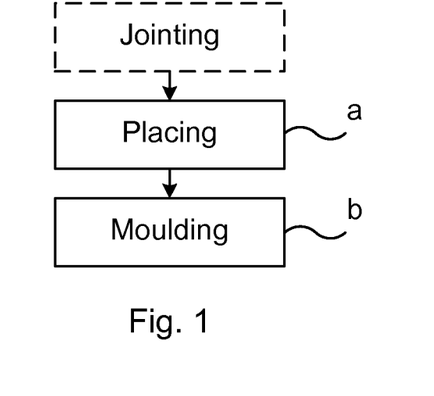
FIG. 1 is a flowchart of a method of building an insulation system around a naked conductor section of a power cable.

With reference to FIG. 1, a general method of jointing a first power cable with a second power cable will now be described.

The naked end section of the first conductor and the naked end section of the second conductor are jointed thus forming a naked conductor section. This jointing is normally performed by thermal joining, for example by means of welding.

In a step a) the naked conductor section is placed in a mold.

In a step b) an insulation system is molded around the naked conductor section. The molding of the insulation system involves injecting a first semiconducting compound into a first mold cavity to form an inner semiconducting layer around the naked conductor section, injecting an insulation compound into a second mold cavity to form an insulation layer around the inner semiconducting layer, and injecting a second semiconducting compound into a third mold cavity to form an outer semiconducting layer around the insulation layer.

Step b) of molding may involve utilizing several molds, one for each layer. Alternatively several mold inserts may be used; one for each layer. For each layer that is being molded, a mold insert may be placed in the mold, thus forming a mold cavity in which a particular layer may be molded. By utilizing mold inserts instead of several molds, costs may be reduced both due to the costs savings of having to invest only in a single mold, and due the reduced time for only having to replace the interior of the mold by means of mold inserts instead of having to replace the entire mold during the molding process.

Figure 2:
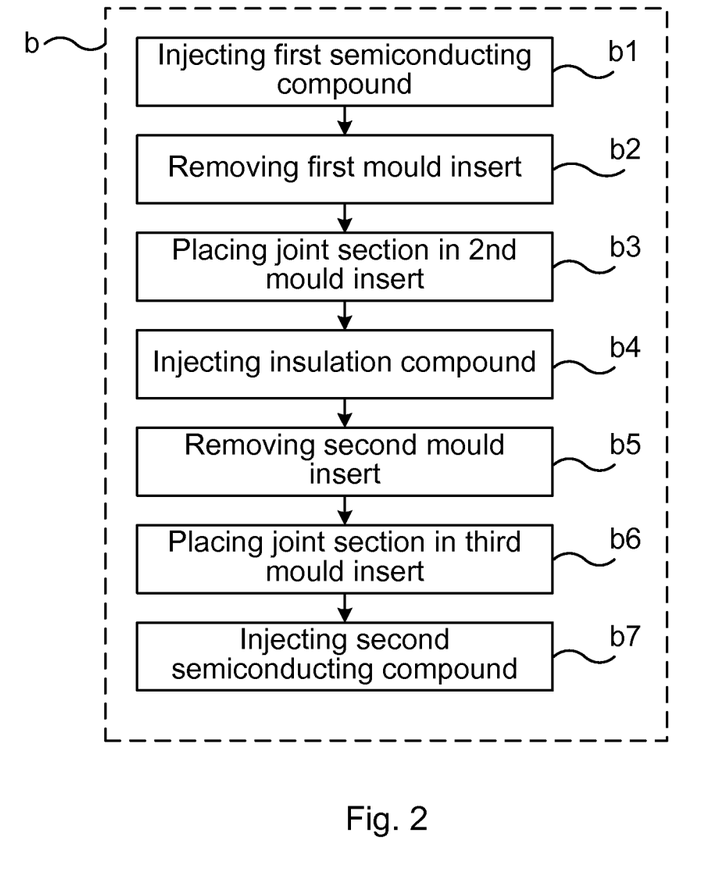
FIG. 2 is a flowchart of a variation of the method depicted in FIG. 1.

FIG. 2 describes the alternative of the method utilizing several mold inserts in more detail. In the method an injection mold is used to handle over-molding of different types and different diameters of polymer layers. Such a mold may include a common frame with an integrated runner system used for all polymer layers. The common frame may also include cooling circuits and an ejection system.

Thus, when several mold inserts are used to restore the insulation system, one mold insert for each layer, step a) further comprises placing the naked conductor section in a first mold insert in the mold. The first mold insert forms a first mold cavity and has a first inner diameter. This first inner diameter corresponds to the outer diameter of the inner semiconducting layer.

FIG. 3 shows an arrangement 1 which includes a first power cable C1 having a first conductor 4a and a second power cable C2 having a second conductor 6a, which are being jointed utilizing mold inserts for the different layers of the insulation system of the jointed power cable. In particular, the arrangement 1 includes a mold insert, for example a first mold insert 3, and sealing rings, for example a first sealing ring R1, and a second sealing ring R2. The exemplified mold insert forms a mold cavity and is similar for all mold inserts described herein, i.e. the first mold insert, a second mold insert and a third mold insert, except that their inner dimensions differ such that different diameter layers may be molded around each other. The sealing rings are arranged to retain the polymer compound, e.g. a first semiconducting compound, an insulation compound, and a second semiconducting compound in the mold insert during molding and to fix the first power cable and the second power cable against the mold.

Step a) may thus further comprise placing a first sealing ring R1 around the first insulation system to seal the first mold insert 3 at one end thereof. Step a) may also comprise placing a second sealing ring R2 around the second insulation system to seal the first mold insert 3 at the other end thereof. As will be understood in the following, each mold insert may be associated with respective sealing rings.

Figure 4:
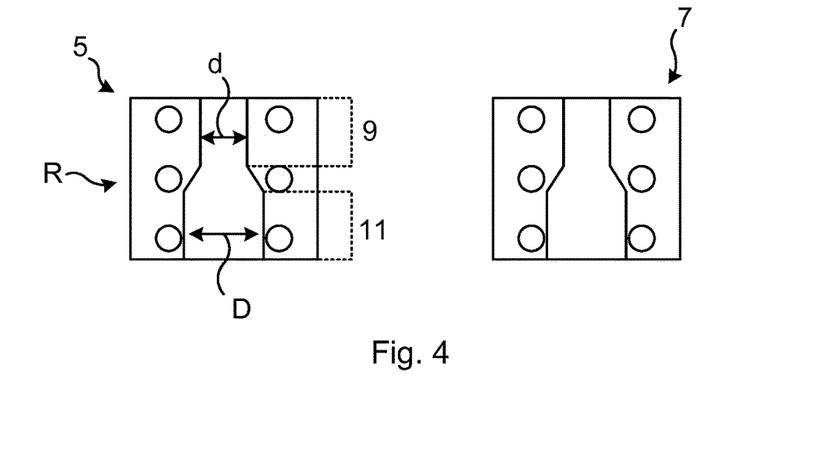
FIG. 4 shows a top view of two halves of an example of a sealing ring.

An example of a sealing ring R is shown in FIG. 4. In particular, two halves 5 and 7 are shown. The sealing ring R has a tubular portion 9 arranged to provide a tight fit around the corresponding layer that is to be molded. The tubular portion 9 may thus have an inner diameter d that provides the required tightness and may essentially correspond to the inner diameter of the corresponding mold insert. This inner diameter d may be slightly smaller, equal to, or slightly larger, than the inner diameter of the corresponding mold insert. The sealing ring R furthermore has a tubular portion 11 which when the sealing ring R is in use is arranged around the outermost semiconducting layer. The tubular portion 11 may thus have an inner diameter D essentially corresponding to the outer diameter of the first power cable and the outer diameter of the second power cable. The outer diameter of the first power cable and the second power cable is generally the same. Here, with the outer diameter of the first power cable/second power cable is generally meant the outer diameter of the outer semiconducting layer of the first insulation system and the second insulation system, respectively, of the already existing first insulation system and second insulation system.

Typically, no outer sheath has been arranged around the first power cable and the second power cable at this point in the manufacturing process. The structure of the sealing ring R is identical for all sealing rings that will be described herein, i.e. the first sealing ring and the second sealing ring, as well as a third, a fourth, a fifth and a sixth sealing ring that will be described in the following. All of these sealing rings may for example be made of metal, or a plastic material.

Returning to FIG. 2, step b may comprise the following steps.

In a step b1) the first semiconducting compound is injected into the first mold insert. The inner semiconducting layer is thereby provided around the naked conductor section. In this manner a joint section provided with an inner semiconducting layer is formed.

In a step b2) the first mold insert is removed from the mold.

The sprue and runner segment formed by the first semiconducting compound is removed using proper tools such as a knife. The surface of the inner semiconducting layer is then smoothened e.g. by glassing and/or grinding.

Furthermore in step b2) a second mold insert with a second inner diameter that is larger than the first inner diameter is placed into the mold. The second mold insert forms a second mold cavity.

In a step b3) the joint section provided with the inner semiconducting layer is placed in the second mold insert.

Step b3) may further comprise placing the third sealing ring around the first insulation system to seal the second mold insert at one end thereof and to place a fourth sealing ring around the second insulation system to seal the second mold insert at the other end thereof.

In a step b4) the insulation compound is injected into the second mold insert. The insulation layer is thereby provided around the inner semiconducting layer of the joint section provided with the inner semiconducting layer. Hence a joint section provided with an insulation layer is formed.

In a step b5) the second mold insert is removed from the mold.

The sprue and runner segment formed by the insulation compound is removed using proper tools such as a knife. The surface of the insulation layer is then smoothened e.g. by glassing and/or grinding.

Furthermore in step b5) a third mold insert with a third inner diameter that is larger than the second inner diameter is placed into the mold. The third mold insert forms a third mold cavity.

In a step b6) the joint section provided with the insulation layer is placed in the third mold insert.

Step b6) may further comprise placing a fifth sealing ring around the first insulation system to seal the third mold insert at one end thereof and to place a sixth sealing ring around the second insulation system to seal the third mold insert at the other end thereof.

In a step b7) the second semiconducting compound is injected into the third mold insert. The outer semiconducting layer is thereby provided around the insulation layer of the joint section provided with the insulation layer.

The sprue and runner segment formed by the second semiconducting compound is removed using proper tools such as a knife. The surface of the outer semiconducting layer is then smoothened e.g. by glassing and/or grinding. The jointed power cable is now ready for the manufacturing of outer layers such as shielding and moisture barrier.

Typically, the first semiconducting compound and the second semiconducting compound are the same thermoplastic material comprising semiconducting or conductive inclusions such as carbon black, carbon nanotubes, graphene, or metal particles. An example of a thermoplastic material is a polyethylene-based thermoplastic blend. The insulation compound is also a thermoplastic material, for example a polyethylene-based thermoplastic blend. Another example of a material, which is not a thermoplastic material, but which may be used for the semiconducting layers and for the insulation layer is XLPE, which for the semiconducting layers may include e.g. carbon black.

A second application for building an insulation system of a power cable will now shortly be described. According to this example, the insulation system of a power cable that has a damaged or defect insulation system is restored. The power cable comprises a conductor, an inner semiconducting layer, an insulation layer arranged around the inner semiconducting layer and an outer semiconducting layer arranged around the insulation layer. The power cable also has a naked conductor section, i.e. a section of the conductor which is not provided with the insulation system. The insulation system has been removed at this section of the power cable to expose the naked conductor section. In particular, it is this section of the power cable that originally had an insulation system with defects, and which is to be restored.

According to the method, this naked conductor section is provided with an insulation system by means of layer-wise molding of all three layers in the same manner as has previously been described for the restoration of the insulation system of the joint.

In order to prepare for the manufacturing of the insulation system, the insulation system normally has a tapering section, which tapers towards a naked conductor section. Similarly, at the other end of the naked conductor section the insulation system normally has a tapering section, also tapering towards the naked conductor section. Steps a) and b) are carried out in the same manner as has been disclosed above. Moreover, steps b1)-b7) may also optionally be performed. In this case the sealing rings are arranged around the ends of the insulation system and over the tapering insulation system portions so as to seal the naked conductor section, and subsequently the layers molded thereon.

Figure 5A:
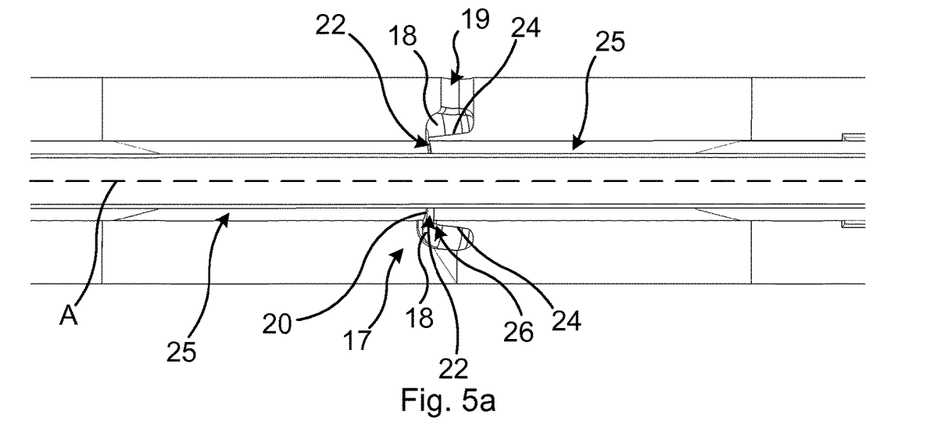
FIG. 5a shows a sectional view of an example of a ring-shaped runner system.

FIG. 5a shows in more detail a portion of a mold insert in section along the central axis A of a power cable, including the ring-shaped runner system 17. The ring-shaped runner system 17 includes a ring-shaped runner 18 that extends circumferentially 360 degrees around a mold cavity 25 and a sprue 19 connected to the ring-shaped runner 18. The ring-shaped runner system 17 includes an inner wall 24 which defines a circumferential gate 22 through which the injected compound may enter the mold cavity 25. The axial distance between inner wall 24 and a mold insert wall 20 gradually increases in the circumferential direction from the sprue 19 to the distal end of the ring-shaped runner 18 relative to the sprue 19, i.e. 180 degrees from the sprue 19. The gate 22 hence increases gradually along the circumference of the ring-shaped runner 18, in a direction away from the sprue 19.

The inner wall 24, or generally the ring-shaped runner 18, may be provided with a cut-out 26 at half a turn from the sprue 19, i.e. at 180 degrees from sprue 19, to provide an opening into the mold cavity 25. The gradual increase of the gate 22 provides uniform distribution of the polymer into the mold cavity 25 and design of the gate 22 and the cut-out 26 increases the packing time.

Figure 5B:
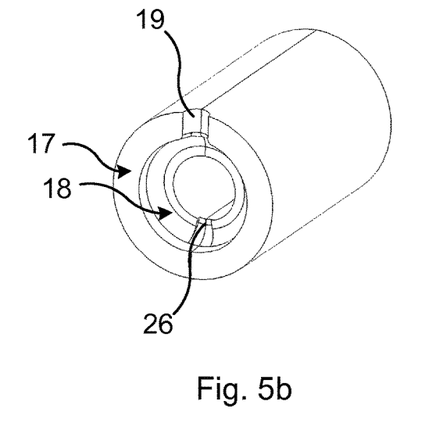
Figure 5C:
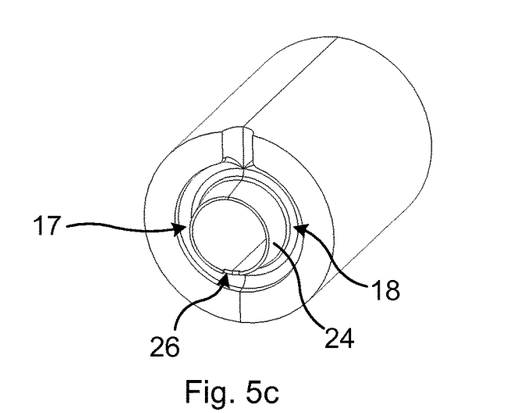

FIG. 5b shows a perspective view of a half of a mold insert thus exposing the ring-shaped runner system 17. FIG. 5c shows a perspective view of the other half of a mold insert exposing the ring-shaped runner system 17.

Figure 6A:
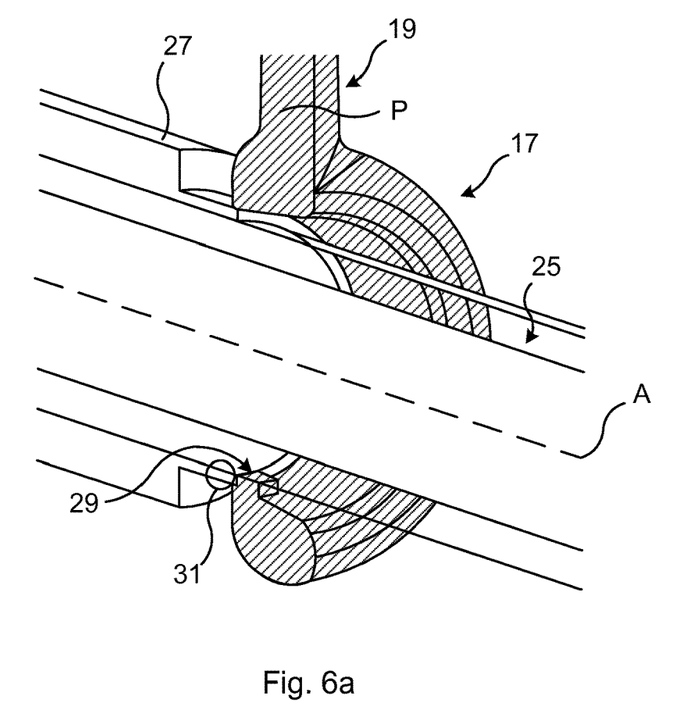
FIGS. 6a-6d shows schematic perspective views of a second example of a ring-shaped runner system during a mold cycle.

According to one variation the ring-shaped runner system 17 may further comprises a sleeve 27 arranged around the mold cavity 25, as schematically illustrated in FIGS. 6a-6d, in which a mold cycle is shown during which a polymer P is being injected into the ring-shaped runner 18. The sleeve 27 may for example be arranged in the mold insert. The sleeve 27 is movable along the central axis A between a first position and a second position. At the beginning of each mold cycle, i.e. before each of the inner semiconducting layer, the insulation layer and the outer semiconducting layer is being molded, the sleeve 27 is arranged in the first position along the central axis A, as shown in FIG. 6a. In the first position, the sleeve 27 and the inner wall of the ring-shaped runner 18 abut each other, whereby entry into the mold cavity 25 is blocked along the entire contact surface of the ring-shaped runner 18 and the sleeve 27. The ring-shaped runner 18 comprises a cut-out defining a single gate opening 29 located opposite to the sprue 19, i.e. at about 180 degrees angle from the sprue 19. When the sleeve 27 is in the first position, a single entry point, i.e. the single gate opening 29, is provided into the mold cavity 25.

Figure 6B:
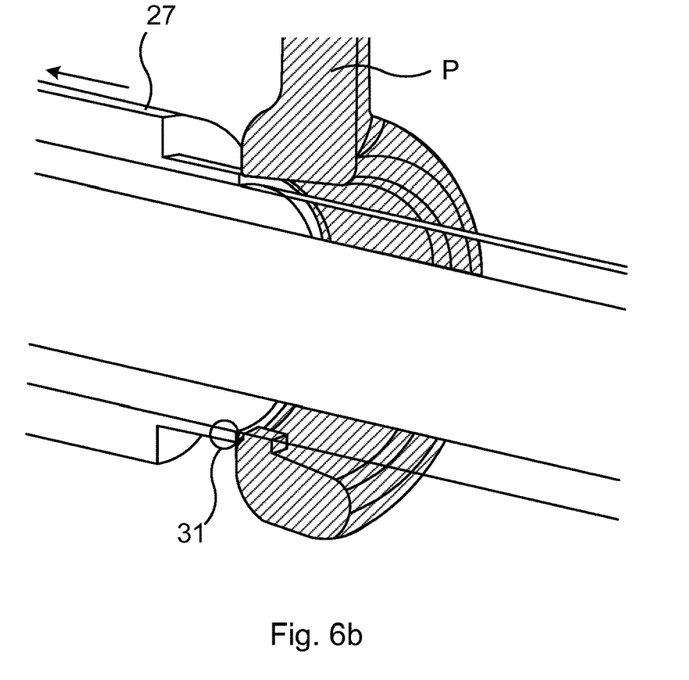
Figure 6C:
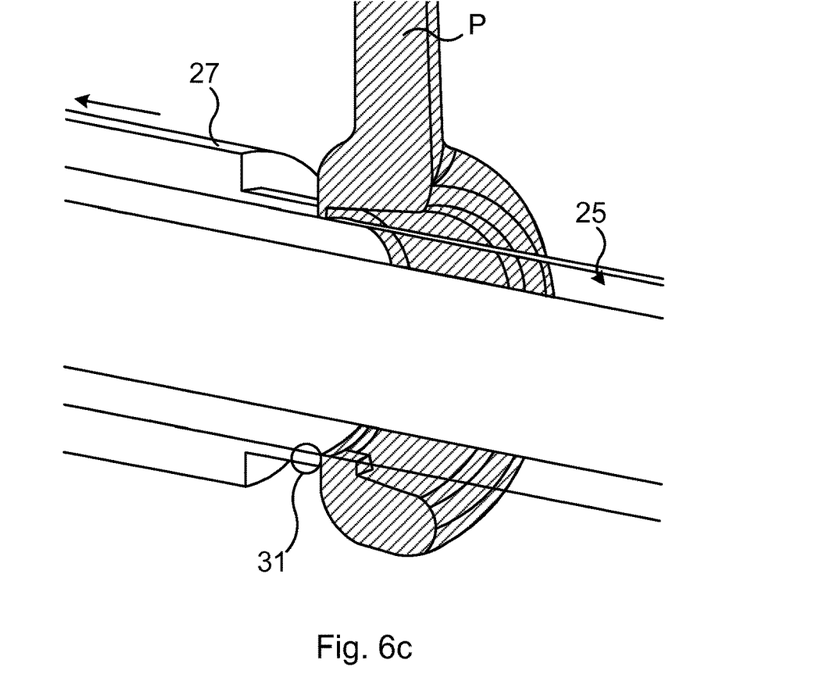
Figure 6D:
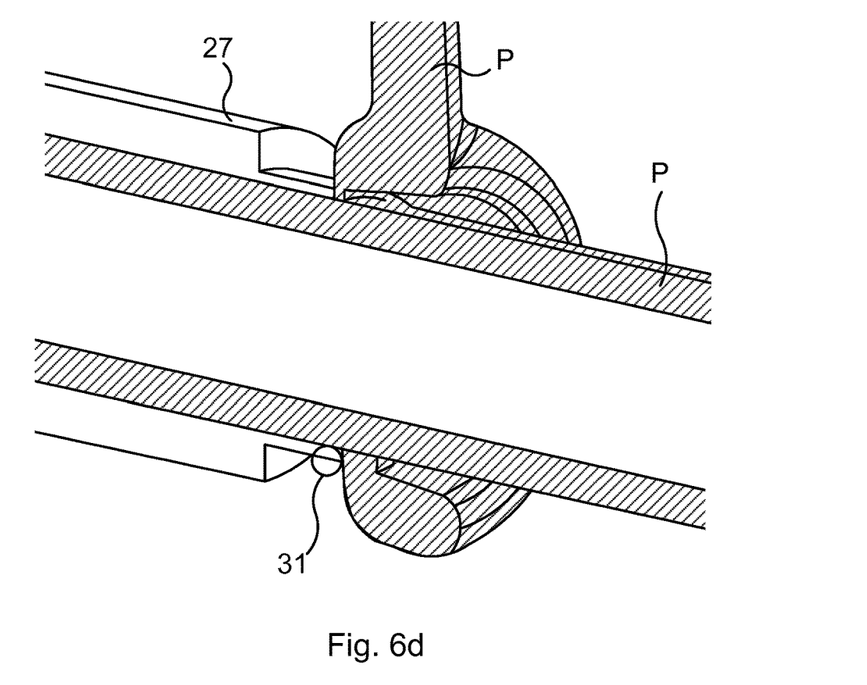

The ring-shaped runner system 17 may further include a sensor 31 arranged to sense at least one of a pressure and temperature in the ring-shaped runner 18. When the ring-shaped runner 18 has been filled with the injected compound, i.e. the polymer P, and the injected compound reaches the single gate opening 29, the sensor 31 provides a signal which triggers the sleeve 27 to move from the first position to the second position along the central axis A, as shown in FIGS. 6b-c. In the second position, the sleeve 27 has moved away from the inner wall. In this way, a gate is created around the entire circumference of the mold cavity 25, and the compound injected into the ring-shaped runner 18 may enter the mold cavity 25 along the entire circumference of the mold cavity 25. FIG. 6d shows the mold cavity 25 being filled with the polymer P.

It should be noted that other types of runner systems could be used as an alternative to a ring-shaped runner system, for example a runner system that provides direct injection molding with a sprue.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A method of building an insulation system around a naked conductor section of a power cable, which power cable has a conductor which includes the naked conductor section and which power cable comprises an insulation system already provided around a majority of the conductor, which insulation system comprises an inner semiconducting layer arranged around the conductor, an insulation layer arranged around the inner semiconducting layer, and an outer semiconducting layer arranged around the insulation layer, and wherein the method comprises:
   a) placing the naked conductor section in a mold, and
   b) moulding an insulation system around the naked conductor section, wherein the molding of the insulation system involves injecting a first semiconducting compound into a first mold cavity to form an inner semiconducting layer around the naked conductor section, injecting an insulation compound into a second mold cavity to form an insulation layer around the inner semiconducting layer, and injecting a second semiconducting compound into a third mold cavity to form an outer semiconducting layer around the insulation layer,
   wherein the mold comprises a ring-shaped runner system having a ring-shaped runner which in the beginning of each mold cycle only has a single gate opening, which single gate opening is located opposite to a sprue, and
   wherein the mold comprises a movable sleeve arranged in a first position at the beginning of each mold cycle thereby forming the single gate opening, wherein the method comprises moving the sleeve axially from the first position to a second position to obtain a gate along the entire circumference of the ring-shaped runner, wherein theسleeve is moved from the first position to the second position when any of the first semiconducting compound, the insulation compound and the second semiconducting compound has reached the single gate opening.

2. The method according to claim 1, wherein step a) includes placing the naked conductor section in a first mold insert in the mold, the first mold insert forming the first mold cavity and having a first inner diameter.

3. The method as according to claim 2, wherein step a) further includes placing a first sealing ring around the insulation system to seal the first mold insert at one end thereof and placing a second sealing ring around the insulation system to seal the first mold insert at the other end thereof.

4. The method according to claim 2, wherein step b) includes:
   b1) injecting the first semiconducting compound into the first mold insert, thereby providing the inner semiconducting layer around the naked conductor section, and thus forming a section provided with the inner, semiconducting layer,
   b2) removing the first mold insert from the mold and placing a second mold insert with a second inner diameter that is larger than the first inner diameter into the mold, the second mold insert forming the second mold cavity,
   b3) placing a joint section provided with the inner semiconducting layer in the second mold insert,
   b4) injecting the insulation compound into the second mold insert, thereby providing the insulation layer around the inner semiconducting layer of the joint section provided with the inner semiconducting layer, and thus forming a section provided with the insulation layer, b5) removing the second mold insert from the mold and placing a third mold insert with a third inner diameter that is larger than the second inner diameter into the mold, the third mold forming the third mold cavity, b6) placing the section provided with the insulation layer in the third mold insert, and b7) injecting the second semiconducting compound into the third mold insert thereby providing the outer semiconducting layer around the insulation layer of the section provided with the insulation layer.

5. The method according to claim 4, wherein step b3) further includes placing a third sealing ring around the insulation system to seal the second mold insert at one end thereof and placing a fourth sealing ring around the insulation system to seal the second mold insert at the other end thereof.

6. The method according claim 4, wherein step b6) further includes placing a fifth sealing ring around the insulation system to seal the third mold insert at one end thereof and placing a sixth sealing ring around the insulation system to seal the third mold insert at the other end thereof.

7. The method according to claim 6, wherein each of the first sealing ring, second sealing ring, third sealing ring, fourth sealing ring, fifth sealing ring, and sixth sealing ring are made of metal.

8. The method according to claim 1, wherein the mold includes a sensor arranged to sense one of pressure and temperature to determine whether one of the first semiconducting compound, the insulation compound and the second semiconducting compound has reached the single gate opening after having been injected into the ring-shaped runner.

9. The method according to claim 1, wherein the power cable is a high voltage power cable.

10. The method according to claim 1, wherein each of the first semiconducting compound and the second semiconducting compound includes a thermoplastic material filled with semiconducting or conductive inclusions and the insulation compound is a thermoplastic material.

11. The method according to claim 1, wherein the power cable is a first power cable wherein the conductor is a first conductor having a first naked conductor section, wherein the method includes, prior to step a), jointing the first naked conductor section with a second naked conductor section of a second power cable to obtain the naked conductor section, which second power cable has a second conductor and an inner semiconducting layer arranged around the first conductor, an insulation layer arranged around the inner semiconducting layer, and an outer semiconducting layer arranged around the insulation layer.

12. A power cable obtainable by the method according to claim 1.

13. The method according to claim 3, wherein step b) includes:

b1) injecting the first semiconducting compound into the first mold insert, thereby providing the inner semiconducting layer around the naked conductor section, and thus forming a section provided with the inner semiconducting layer, b2) removing the first mold insert from the mold and placing a second mold insert with a second inner diameter that is larger than the first inner diameter into the mold, the second mold insert forming the second mold cavity, b3) placing the joint section provided with the inner semiconducting layer in the second mold insert, b4) injecting the insulation compound into the second mold insert, thereby providing the insulation layer around the inner semiconducting layer of the joint section provided with the inner semiconducting layer, and thus forming a section provided with the insulation layer, b5) removing the second mold insert from the mold and placing a third mold insert with a third inner diameter that is larger than the second inner diameter into the mold, the third mold insert forming the third mold cavity, b6) placing the section provided with the insulation layer in the third mold insert, and b7) injecting the second semiconducting compound into the third mold insert, thereby providing the outer semiconducting layer around the insulation layer of the section provided with the insulation layer.

14. The method according claim 5, wherein step b6) further includes placing a fifth sealing ring around the insulation system to seal the third mold insert at one end thereof and placing a sixth sealing ring around the insulation system to seal the third mold insert at the other end thereof.

15. The method according to claim 2, wherein the mold includes a sensor arranged to sense one of pressure and temperature to determine whether one of the first semiconducting compound, the insulation compound and the second semiconducting compound has reached the single gate opening after having been injected into the ring-shaped runner.

16. The method according to claim 2, wherein the power cable is a high voltage power cable.

17. The method according to claim 2, wherein each of the first semiconducting compound and the second semiconducting compound includes a thermoplastic material filled with semiconducting or conductive inclusions and the insulation compound is a thermoplastic material.

18. The method according to claim 2, wherein the power cable is a first power cable wherein the conductor is a first conductor having a first naked conductor section, wherein the method includes, prior to step a), jointing the first naked conductor section with a second naked conductor section of a second power cable to obtain the naked conductor section, which second power cable has a second conductor and an inner semiconducting layer arranged around the first conductor, an insulation layer arranged around the inner semiconducting layer, and an outer semiconducting layer arranged around the insulation layer.

* * * * *

UNITED STATES PATENT AND TRADEMARK OFFICE
CERTIFICATE OF CORRECTION

| | | |
|---|---|---|
| PATENT NO. | : 10,483,730 B2 | Page 1 of 1 |
| APPLICATION NO. | : 15/740518 | |
| DATED | : November 19, 2019 | |
| INVENTOR(S) | : Bednarowski et al. | |

It is certified that error appears in the above-identified patent and that said Letters Patent is hereby corrected as shown below:

On the Title Page

Column 2, (74) Attorney, Agent or Firm:
"Whitmyher IP Group LLC"

Should read:
--Whitmyer IP Group LLC--

In the Claims

Column 10, Claim 1, Line 13:
"b) moulding an insulation system around the naked con-"

Should read:
--b) molding an insulation system around the naked con- --

Column 11, Claim 6, Line 17, (approx.):
"6. The method according claim 4, wherein step b6) further"

Should read:
--6. The method according to claim 4, wherein step b6) further--

Signed and Sealed this
Fourteenth Day of January, 2020

Andrei Iancu
*Director of the United States Patent and Trademark Office*